(12) United States Patent
Yamamoto (10) Patent No.: US 12,341,122 B2
(45) Date of Patent: Jun. 24, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yoko Yamamoto, Himeji Hyogo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 31 days.

(21) Appl. No.: 17/674,622

(22) Filed: Feb. 17, 2022

(65) Prior Publication Data
US 2023/0091217 A1   Mar. 23, 2023

(30) Foreign Application Priority Data
Sep. 17, 2021   (JP) .................................. 2021-152687

(51) Int. Cl.
| | |
|---|---|
| *H01L 23/31* | (2006.01) |
| *H01L 23/00* | (2006.01) |
| *H01L 23/495* | (2006.01) |

(52) U.S. Cl.
CPC .......... *H01L 24/32* (2013.01); *H01L 23/3107* (2013.01); *H01L 23/49541* (2013.01); *H01L 24/48* (2013.01); *H01L 24/73* (2013.01); *H01L 2224/32054* (2013.01); *H01L 2224/32225* (2013.01); *H01L 2224/48227* (2013.01); *H01L 2224/73265* (2013.01); *H01L 2924/1531* (2013.01)

(58) Field of Classification Search
None
See application file for complete search history.

(56) References Cited

U.S. PATENT DOCUMENTS

| | | | | |
|---|---|---|---|---|
| 6,087,721 | A * | 7/2000 | Akhnoukh | .............. H01L 24/06 257/370 |
| 11,948,868 | B2 * | 4/2024 | Talledo | ............... H01L 23/3142 |
| 12,169,216 | B2 * | 12/2024 | Tachi | ................ H01L 23/49562 |

(Continued)

FOREIGN PATENT DOCUMENTS

| | | |
|---|---|---|
| JP | 2009-277949 A | 11/2009 |
| JP | 2010-147162 A | 7/2010 |

(Continued)

OTHER PUBLICATIONS

Decision to Grant a Patent mailed Jan. 7, 2025 in corresponding Japanese Patent Application No. 2021-152687, 6 pages (with English machine translation).

*Primary Examiner* — Joseph C. Nicely
*Assistant Examiner* — E. Rhett Cheek
(74) *Attorney, Agent, or Firm* — Kim & Stewart LLP (57) ABSTRACT

A semiconductor device of embodiments includes: a die pad including a first region and a second region surrounding the first region and thinner than the first region; a semiconductor chip including an upper electrode, a lower electrode, and a silicon carbide layer between the upper electrode and the lower electrode and provided on an inner side rather than the second region on a surface of the die pad; and a connection layer for connecting the lower electrode to the surface.

12 Claims, 8 Drawing Sheets

(56) References Cited

U.S. PATENT DOCUMENTS

| | | | | |
|---|---|---|---|---|
| 2005/0035434 | A1* | 2/2005 | Fissore | H01L 25/072 |
| | | | | 257/E25.016 |
| 2008/0116553 | A1* | 5/2008 | Rossi | H01L 23/552 |
| | | | | 257/678 |
| 2010/0181658 | A1* | 7/2010 | Yamashita | H01L 23/49833 |
| | | | | 257/676 |
| 2014/0061821 | A1 | 3/2014 | Kawano et al. | |
| 2014/0264383 | A1* | 9/2014 | Kajiwara | H01L 23/3192 |
| | | | | 257/77 |
| 2015/0194409 | A1* | 7/2015 | Chuang | H01L 24/13 |
| | | | | 257/737 |
| 2017/0092596 | A1* | 3/2017 | Yoshihara | H01L 21/4825 |
| 2018/0090463 | A1* | 3/2018 | Satou | H01L 24/97 |
| 2018/0240787 | A1* | 8/2018 | Tanimoto | H01L 24/49 |
| 2018/0366400 | A1* | 12/2018 | Mohn | H01L 25/072 |
| 2019/0295981 | A1* | 9/2019 | Roesner | H01L 29/45 |
| 2019/0326248 | A1* | 10/2019 | Hori | H01L 24/45 |
| 2019/0393184 | A1* | 12/2019 | Kondo | H01L 24/06 |
| 2020/0075529 | A1* | 3/2020 | Otsuka | H01L 23/49531 |
| 2020/0350235 | A1* | 11/2020 | Michikoshi | H01L 23/49562 |
| 2021/0118837 | A1* | 4/2021 | Takahashi | H01L 24/49 |
| 2022/0148949 | A1* | 5/2022 | Hayashi | H01L 23/49568 |
| 2024/0079296 | A1* | 3/2024 | Kanda | H01L 23/49531 |
| 2024/0186310 | A1* | 6/2024 | Tanaka | H01L 27/016 |

FOREIGN PATENT DOCUMENTS

| | | | |
|---|---|---|---|
| JP | 2010-165992 | A | 7/2010 |
| JP | 2014-053344 | A | 3/2014 |
| JP | 2015-041684 | A | 3/2015 |
| JP | 2016040839 | A | 3/2016 |
| JP | 2019047061 | A * | 3/2019 |
| JP | 2021-002637 | A | 1/2021 |
| WO | 2019/102694 | A1 | 5/2019 |
| WO | 2020/235410 | A1 | 11/2020 |

* cited by examiner

SEMICONDUCTOR DEVICE

CROSS-REFERENCE TO RELATED APPLICATION

This application is based upon and claims the benefit of priority from Japanese Patent Application No. 2021-152687, filed on Sep. 17, 2021, the entire contents of which are incorporated herein by reference.

FIELD

Embodiments described herein relate generally to a semiconductor device.

BACKGROUND

In a semiconductor device in which a semiconductor chip is fixed on a die pad using a connection layer such as solder, high reliability is required for a connection portion using the connection layer. For example, when the semiconductor chip is peeled off at the connection portion due to temperature changes during the use of the semiconductor device, the device characteristics of the semiconductor device change, which causes a problem.

DETAILED DESCRIPTION

A semiconductor device of embodiments includes: a die pad including a first region and a second region surrounding the first region and thinner than the first region; a semiconductor chip including an upper electrode, a lower electrode, and a silicon carbide layer between the upper electrode and the lower electrode, the semiconductor chip provided on a surface of the die pad, and the semiconductor chip provided on an inner side rather than the second region; and a connection layer provided between the lower electrode and the surface, and the connection layer connecting the lower electrode and the surface.

Hereinafter, embodiments will be described with reference to the diagrams. In the following description, the same or similar members and the like may be denoted by the same reference numerals, and the description of the members and the like once described may be omitted as appropriate.

First Embodiment

A semiconductor device of a first embodiment includes: a die pad including a first region and a second region surrounding the first region and thinner than the first region; a semiconductor chip including an upper electrode, a lower electrode, and a silicon carbide layer between the upper electrode and the lower electrode, the semiconductor chip provided on a surface of the die pad, and the semiconductor chip provided on an inner side rather than the second region; and a connection layer provided between the lower electrode and the surface, and the connection layer connecting the lower electrode and the surface.

The semiconductor device of the first embodiment is a semiconductor device 100 in which a diode chip including a silicon carbide layer is packaged with resin.

Figure 1:
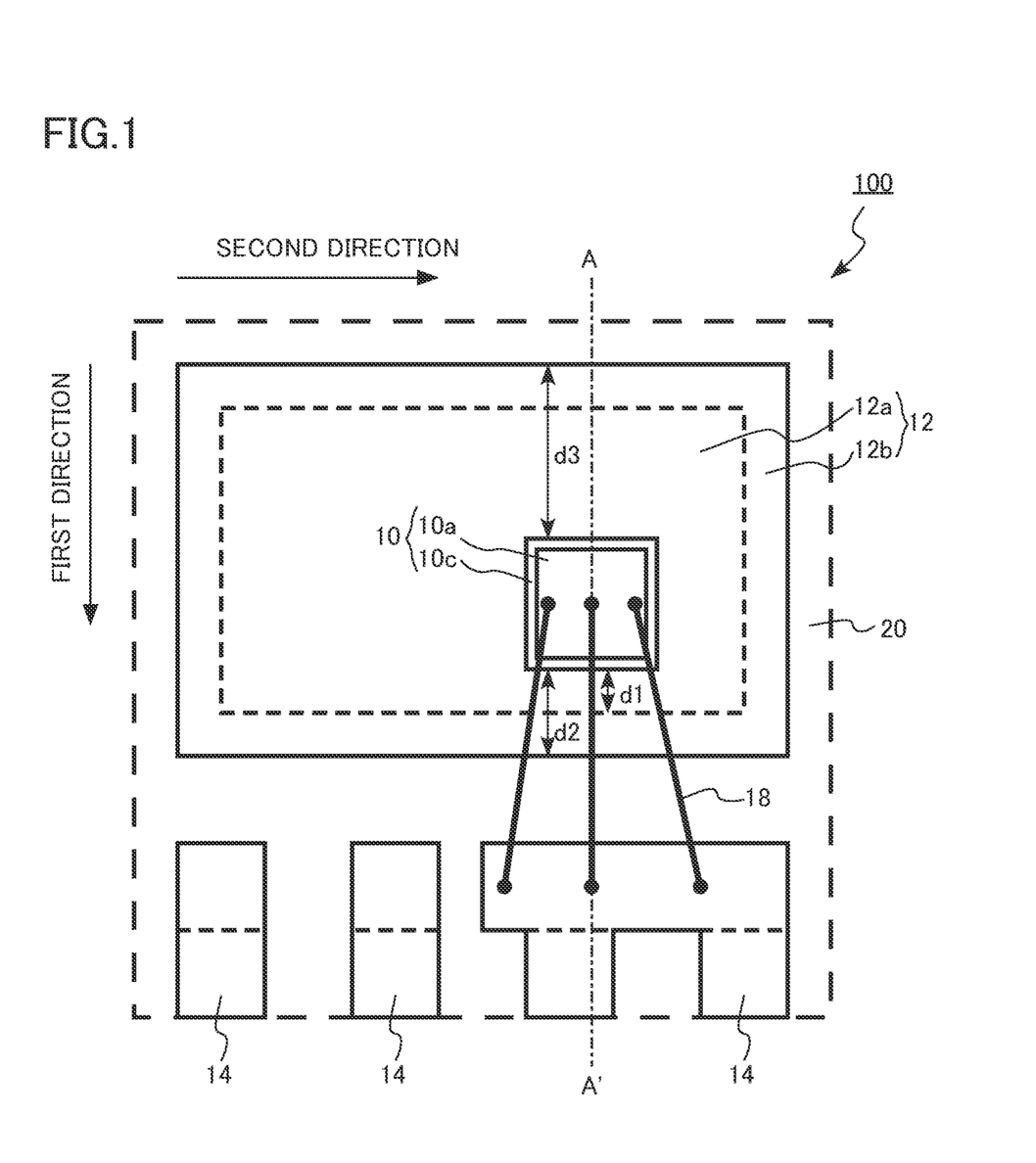
FIG. 1 is a schematic top view of a semiconductor device of a first embodiment.
Figure 2:
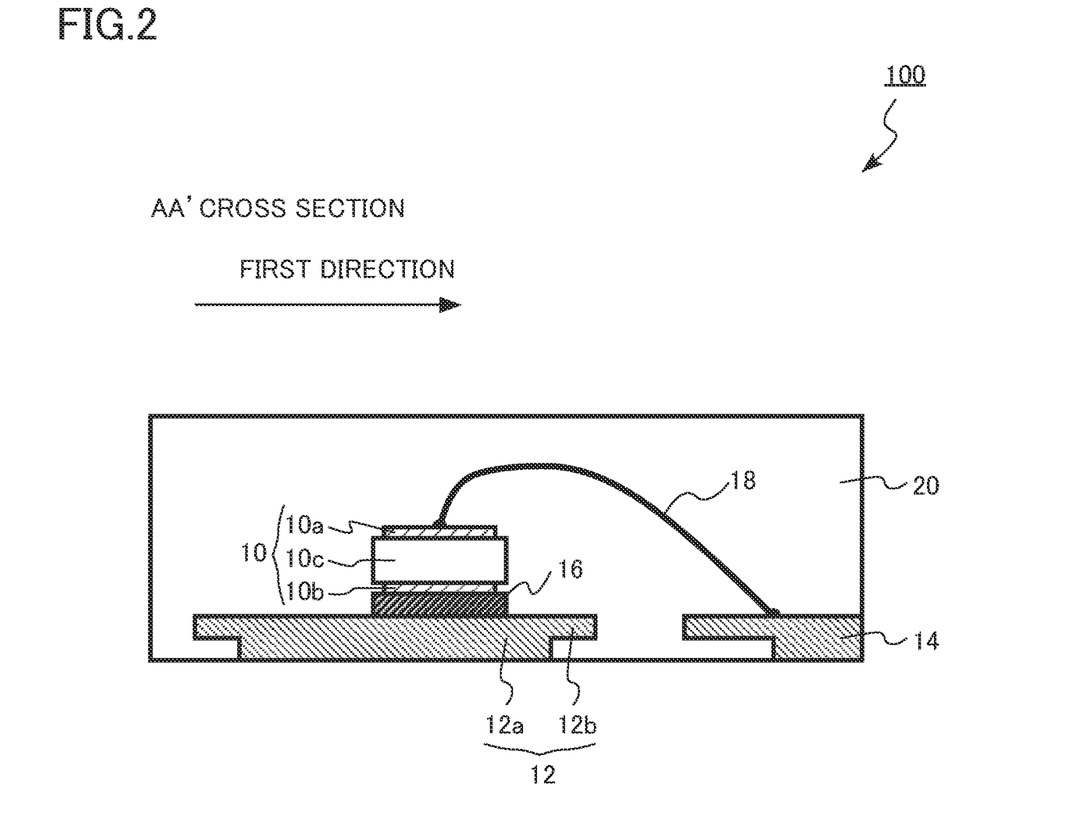
FIG. 2 is a schematic cross-sectional view of the semiconductor device of the first embodiment.
Figure 3:
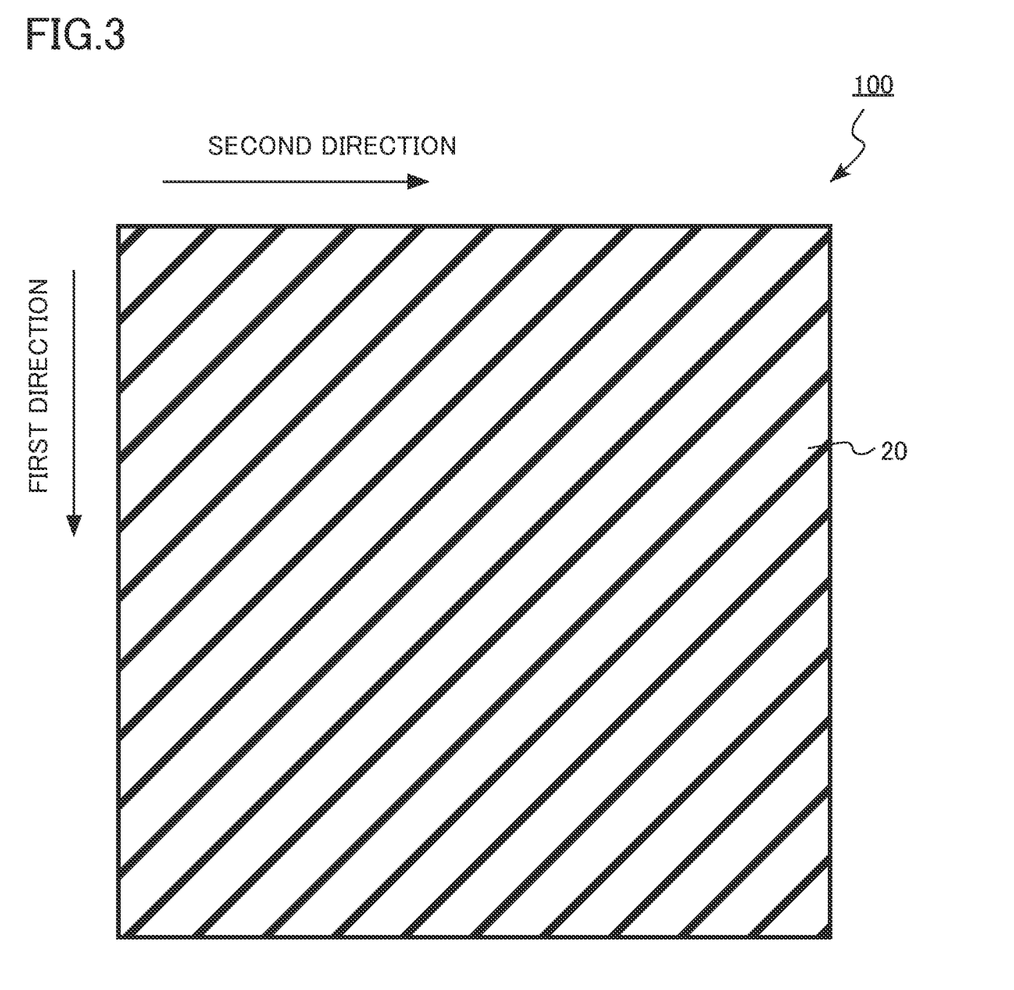
FIG. 3 is a schematic top view of the semiconductor device of the first embodiment.
Figure 4:
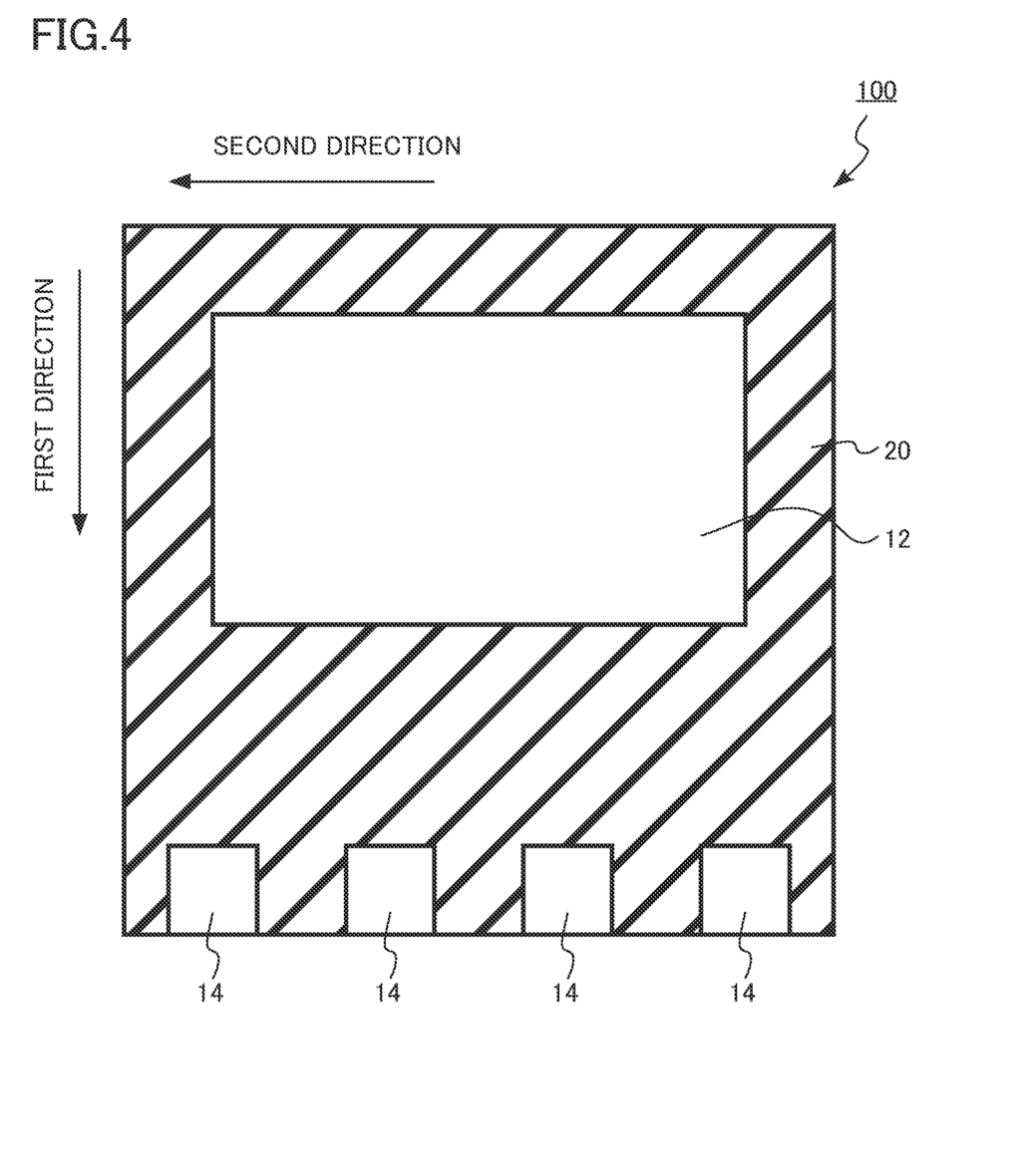
FIG. 4 is a schematic bottom view of the semiconductor device of the first embodiment.

FIG. 1 is a schematic top view of the semiconductor device of the first embodiment. FIG. 1 is a top view excluding a resin layer. FIG. 2 is a schematic cross-sectional view of the semiconductor device of the first embodiment. FIG. 2 is a cross-sectional view taken along the line AA' of FIG. 1. FIG. 3 is a schematic top view of the semiconductor device of the first embodiment. FIG. 4 is a schematic bottom view of the semiconductor device of the first embodiment.

The semiconductor device 100 includes a diode chip 10 (semiconductor chip), a die pad 12, a lead portion 14, a connection layer 16, a plurality of bonding wires 18, and a resin layer 20.

The diode chip 10 includes an anode electrode 10a (upper electrode), a cathode electrode 10b (lower electrode), and a silicon carbide layer 10c. The die pad 12 includes a central region 12a (first region) and a peripheral region 12b (second region).

The diode chip 10 is an example of a semiconductor chip. The anode electrode 10a is an example of the upper electrode. The cathode electrode 10b is an example of the lower electrode. The central region 12a is an example of the first region. The peripheral region 12b is an example of the second region.

The die pad 12 has, for example, a rectangular shape. The die pad 12 includes the central region 12a and the peripheral region 12b. The peripheral region 12b surrounds the central region 12a.

As shown in FIG. 2, the thickness of the peripheral region 12b is smaller than the thickness of the central region 12a. The thickness of the central region 12a is equal to or more than 0.1 mm and equal to or less than 1 mm, for example. The thickness of the peripheral region 12b is equal to or less than half the thickness of the central region 12a, for example.

The thin peripheral region 12b is provided to improve the support characteristics of the die pad 12 by the resin layer 20.

The die pad 12 is a metal. The die pad 12 is, for example, copper or a copper alloy.

Hereinafter, as shown in FIG. 1, the direction parallel to one side of the die pad 12 is defined as a first direction, and the direction parallel to the other side of the die pad 12 is defined as a second direction. For example, the first direction is a direction parallel to the short side of the die pad 12, and the second direction is a direction parallel to the long side of the die pad 12.

In addition, hereinafter, for convenience of explanation, the direction in which the diode chip 10 of the die pad 12 is provided is referred to as upper, and the opposite direction is referred to as lower.

The diode chip 10 includes the anode electrode 10a, the cathode electrode 10b, and the silicon carbide layer 10c. The silicon carbide layer 10c is provided between the anode electrode 10a and the cathode electrode 10b.

The diode chip 10 is provided on the die pad 12. The diode chip 10 is provided on the surface of the die pad 12. The diode chip 10 is provided on the inner side rather than the peripheral region 12b on the surface of the die pad 12.

The chip size of the diode chip 10 is, for example, 1 mm×1 mm. The thickness of the silicon carbide layer 10c is equal to or more than 50 µm and equal to or less than 150 µm, for example.

A first distance (d1 in FIG. 1) between the diode chip 10 and the peripheral region 12b in a direction parallel to the surface of the die pad 12 is equal to or more than the thickness of the silicon carbide layer 10c, for example. The first distance (d1 in FIG. 1) between the diode chip 10 and the peripheral region 12b in the first direction is equal to or more than the thickness of the silicon carbide layer 10c, for example. The first distance d1 is equal to or more than 50 µm, for example.

A second distance (d2 in FIG. 1) between the diode chip 10 and the end of the die pad 12 in the first direction is shorter than a third distance (d3 in FIG. 1) between the diode chip 10 and the end of the die pad 12 in a direction opposite to the first direction, for example. The difference between the third distance d3 and the second distance d2 is equal to or more than the width of the diode chip 10 in the first direction, for example. The difference between the third distance d3 and the second distance d2 is equal to or more than three times the width of the diode chip 10 in the first direction, for example. The difference between the third distance d3 and the second distance d2 is equal to or more than 1 mm, for example.

The connection layer 16 is provided between the die pad 12 and the diode chip 10. The connection layer 16 connects the die pad 12 and the diode chip 10 to each other. The connection layer 16 connects the cathode electrode 10b of the diode chip 10 to the surface of the die pad 12.

The connection layer 16 is a conductor. The connection layer 16 contains, for example, solder. The connection layer 16 is, for example, a solder layer.

The thickness of the connection layer 16 is equal to or more than 2 µm and equal to or less than 10 µm, for example.

The lead portion 14 is provided in the first direction of the die pad 12. The lead portion 14 is not provided, for example, in a direction opposite to the first direction of the die pad 12. The lead portion 14 is not provided, for example, in the second direction of the die pad 12 and in a direction opposite to the second direction.

The lead portion 14 is provided to obtain an electrical connection between the diode chip 10 and the outside of the semiconductor device 100.

The lead portion 14 is a metal. The lead portion 14 is, for example, copper or a copper alloy. The lead portion 14 is formed of, for example, the same material as the die pad 12.

The bonding wire 18 connects the anode electrode 10a of the diode chip 10 and the lead portion 14 to each other. The bonding wire 18 electrically connects the anode electrode 10a and the lead portion 14 to each other.

The bonding wire 18 is a metal wire. The bonding wire 18 contains, for example, copper (Cu) or aluminum (Al). The bonding wire 18 is, for example, a copper wire or an aluminum wire.

The resin layer 20 surrounds the diode chip 10 and the bonding wire 18. The resin layer 20 has a function of protecting the diode chip 10 and the bonding wire 18.

The resin layer 20 contains a resin. The resin layer 20 contains, for example, an epoxy resin.

As shown in FIG. 3, for example, only the resin layer 20 is present on the top surface of the semiconductor device 100. In addition, as shown in FIG. 4, for example, a part of the die pad 12 and a part of the lead portion 14 are exposed on the bottom surface of the semiconductor device 100.

Next, the function and effect of the semiconductor device of the first embodiment will be described.

In a semiconductor device in which a semiconductor chip is fixed on a die pad using a connection layer such as solder, high reliability is required for a connection portion using the connection layer. For example, when the semiconductor chip is peeled off at the connection portion due to temperature changes during the use of the semiconductor device, the device characteristics of the semiconductor device change, which causes a problem. For example, when the semiconductor device is a diode, if peeling occurs at the connection portion, the on-resistance of the diode increases, which causes a problem.

The peeling of the semiconductor chip is caused by the stress generated by the difference in the coefficient of thermal expansion between the members formed of different materials, such as a semiconductor chip, a die pad, a resin layer, a solder layer, and a bonding wire. When the semiconductor chip contains a silicon carbide layer, for example, the peeling of the semiconductor chip is accelerated as compared with a case where the semiconductor chip contains a silicon layer. It is thought that the reason why the peeling of the semiconductor chip is accelerated when the semiconductor chip contains the silicon carbide layer is related to the fact that the silicon carbide layer has a higher Young's modulus than the silicon layer. In addition, it is also thought that the reason why the peeling of the semiconductor chip is accelerated when the semiconductor chip contains the silicon carbide layer is related to the fact that the amount of current per chip unit area in the semiconductor chip using the silicon carbide layer is large and accordingly the amount of heat generation is large as compared with the semiconductor chip using the silicon layer.

Figure 5:
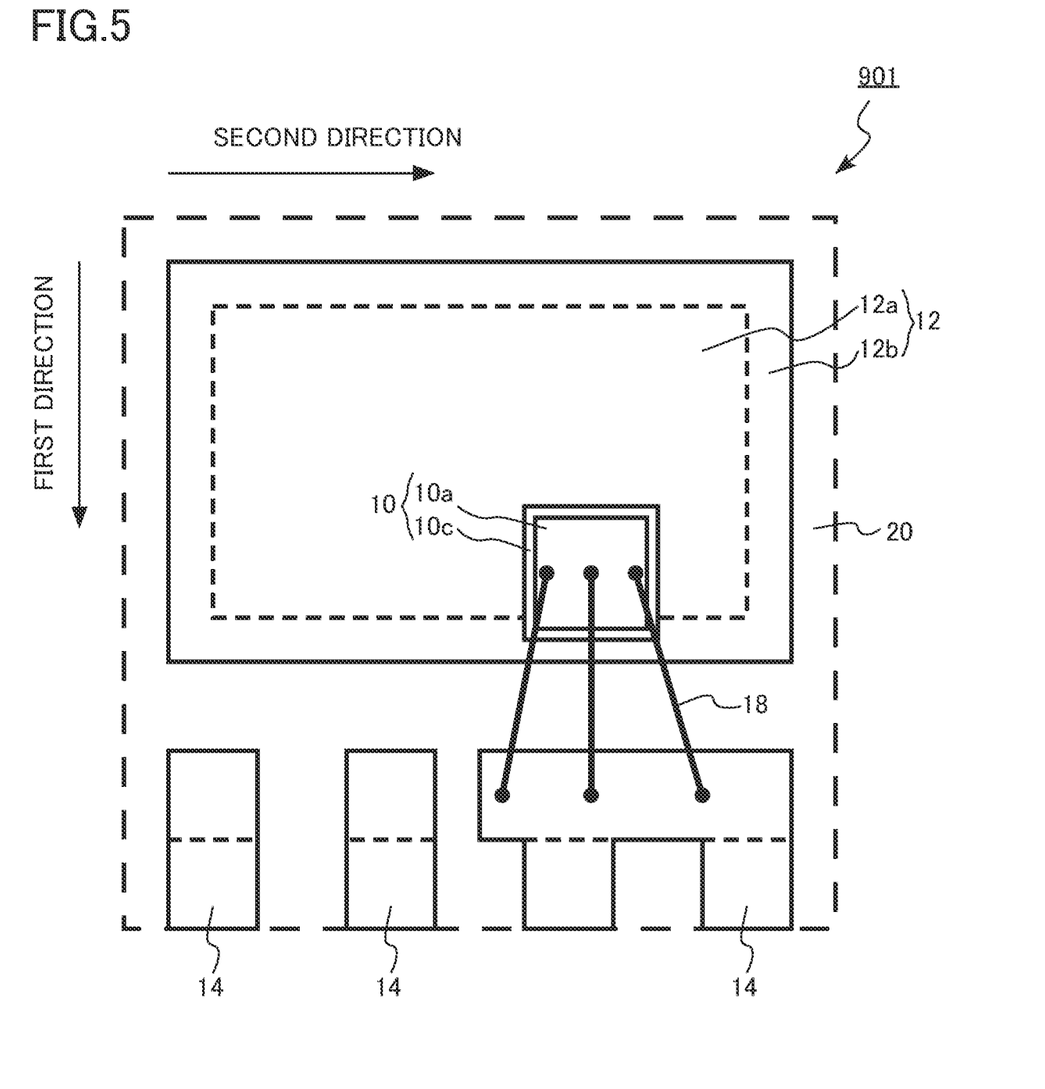
FIG. 5 is a schematic top view of a semiconductor device of a first comparative example of the first embodiment.

FIG. 5 is a schematic top view of a semiconductor device of a first comparative example of the first embodiment. FIG. 5 is a diagram corresponding to FIG. 1 of the first embodiment.

The semiconductor device of the first comparative example is a semiconductor device 901. In the semiconductor device 901, similarly to the semiconductor device 100 of the first embodiment, a diode chip containing a silicon carbide layer is packaged with resin.

The semiconductor device 901 of the first comparative example is different from the semiconductor device 100 of the first embodiment in that a part of the diode chip 10 is provided in the peripheral region 12b of the die pad 12.

In the semiconductor device 901, the diode chip 10 is likely to be peeled off at the connection portion using the connection layer 16. It is thought that this is because the stress generated at the boundary between the central region 12a and the peripheral region 12b having different thicknesses increases. Therefore, it is thought that the stress applied to the connection portion between the die pad 12 and the diode chip 10 increases and accordingly, the diode chip 10 is likely to be peeled off.

In the semiconductor device 100 of the first embodiment, the diode chip 10 is provided on the inner side rather than the peripheral region 12b on the surface of the die pad 12. Therefore, the stress applied to the connection portion between the die pad 12 and the diode chip 10 is smaller than that in the semiconductor device 901 of the first comparative example. As a result, since the peeling of the diode chip 10 is suppressed, the reliability of the semiconductor device 100 is improved.

From the viewpoint of reducing the stress applied to the connection portion between the die pad 12 and the diode chip 10, the first distance (d1 in FIG. 1) between the diode chip 10 and the peripheral region 12b in the first direction is preferably equal to or more than the thickness of the silicon carbide layer 10c. In addition, from the viewpoint of reducing the stress applied to the connection portion between the die pad 12 and the diode chip 10, the first distance d1 is preferably equal to or more than 50 μm, and more preferably equal to or more than 100 μm.

Figure 6:
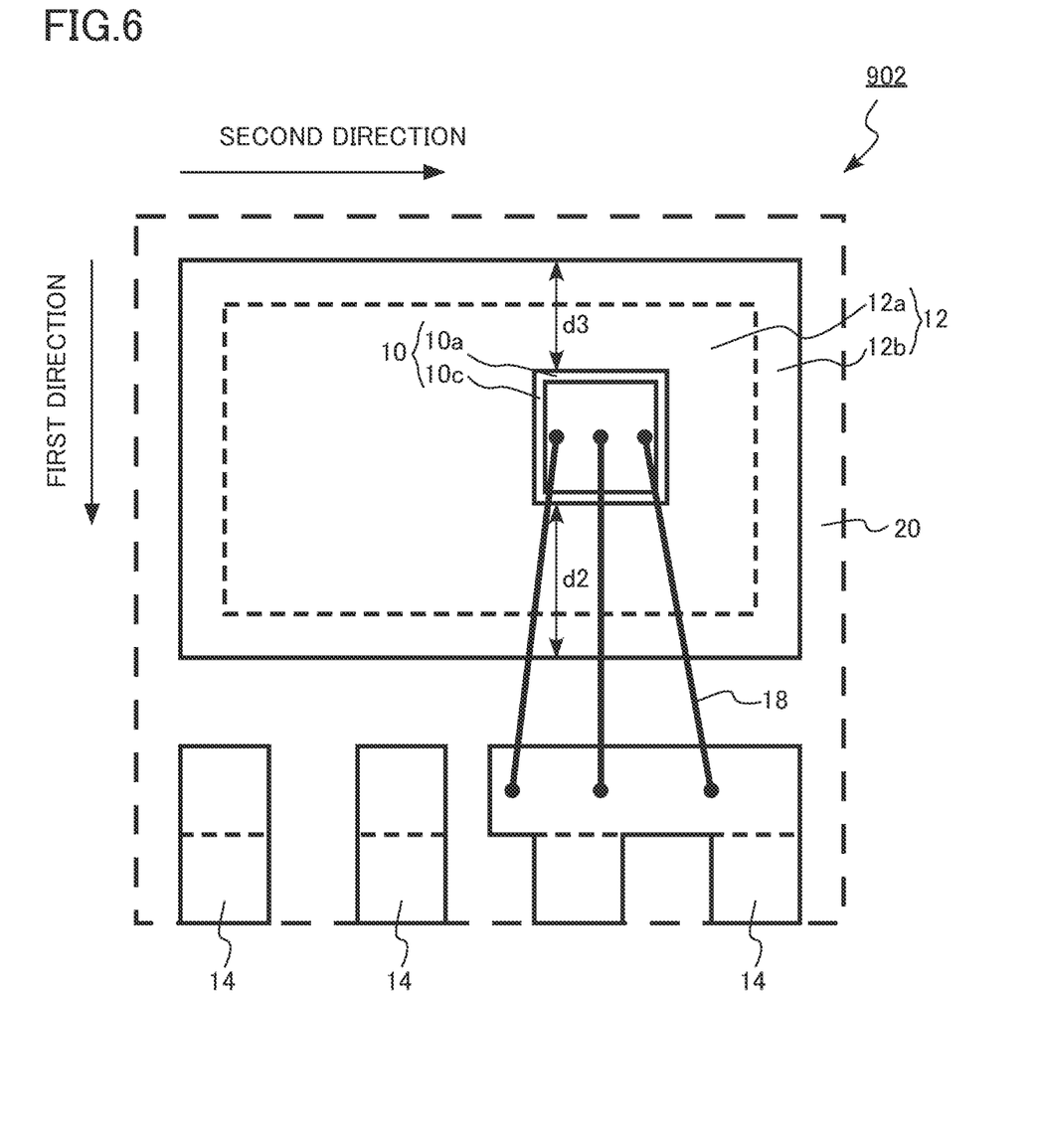
FIG. 6 is a schematic top view of a semiconductor device of a second comparative example of the first embodiment.

FIG. 6 is a schematic top view of a semiconductor device of a second comparative example of the first embodiment. FIG. 6 is a diagram corresponding to FIG. 1 of the first embodiment.

The semiconductor device of the second comparative example is a semiconductor device 902. In the semiconductor device 902, similarly to the semiconductor device 100 of the first embodiment, a diode chip containing a silicon carbide layer is packaged with resin.

The semiconductor device 902 of the second comparative example is different from the semiconductor device 100 of the first embodiment in that the second distance (d2 in FIG. 6) between the diode chip 10 and the end of the die pad 12 in the first direction is longer than the third distance (d3 in FIG. 6) between the diode chip 10 and the end of the die pad 12 in a direction opposite to the first direction.

Due to the shrinkage or expansion of the bonding wire 18 and the resin layer 20 surrounding the bonding wire 18, the stress applied to the connection portion between the die pad 12 and the diode chip 10 changes. It is considered that as the length of the bonding wire 18 increases, the stress applied to the connection portion between the die pad 12 and the diode chip 10 increases.

In the semiconductor device 100, the second distance (d2 in FIG. 1) between the diode chip 10 and the end of the die pad 12 in the first direction is shorter than the third distance (d3 in FIG. 1) between the diode chip 10 and the end of the die pad 12 in a direction opposite to the first direction.

By making the second distance d2 shorter than the third distance d3, the distance between the diode chip 10 and the lead portion 14 becomes shorter than that in the semiconductor device 902 of the second comparative example. By shortening the distance between the diode chip 10 and the lead portion 14, the length of the bonding wire 18 can be shortened. Therefore, as compared with the semiconductor device 902 of the second comparative example, the stress applied to the connection portion between the die pad 12 and the diode chip 10 due to the bonding wire 18 and the resin layer 20 surrounding the bonding wire 18 is reduced. As a result, since the peeling of the diode chip 10 is suppressed, the reliability of the semiconductor device 100 is improved.

From the viewpoint of reducing the stress applied to the connection portion between the die pad 12 and the diode chip 10, the difference between the third distance d3 and the second distance d2 is preferably equal to or more than the width of the diode chip 10 in the first direction. From the viewpoint of reducing the stress applied to the connection portion between the die pad 12 and the diode chip 10, the difference between the third distance d3 and the second distance d2 is preferably equal to or more than 1 mm, and more preferably equal to or more than 2 mm.

In the semiconductor device 100, the thickness of the connection layer 16 is preferably equal to or less than 10 μm. By setting the thickness of the connection layer 16 to be equal to or less than 10 μm, the resistance of the connection layer 16 is reduced and the amount of heat generated in the connection layer 16 is suppressed. Therefore, the stress applied to the connection portion between the die pad 12 and the diode chip 10 is reduced. As a result, since the peeling of the diode chip 10 is suppressed, the reliability of the semiconductor device 100 is improved.

As described above, according to the first embodiment, it is possible to realize a semiconductor device in which the peeling of a semiconductor chip is suppressed to improve the reliability.

Second Embodiment

A semiconductor device of a second embodiment is different from the semiconductor device of the first embodiment in that the angles formed by the extension directions of a plurality of bonding wires and the first direction are equal to or less than 5°. Hereinafter, the description of a part of the content overlapping the first embodiment may be omitted.

Figure 7:
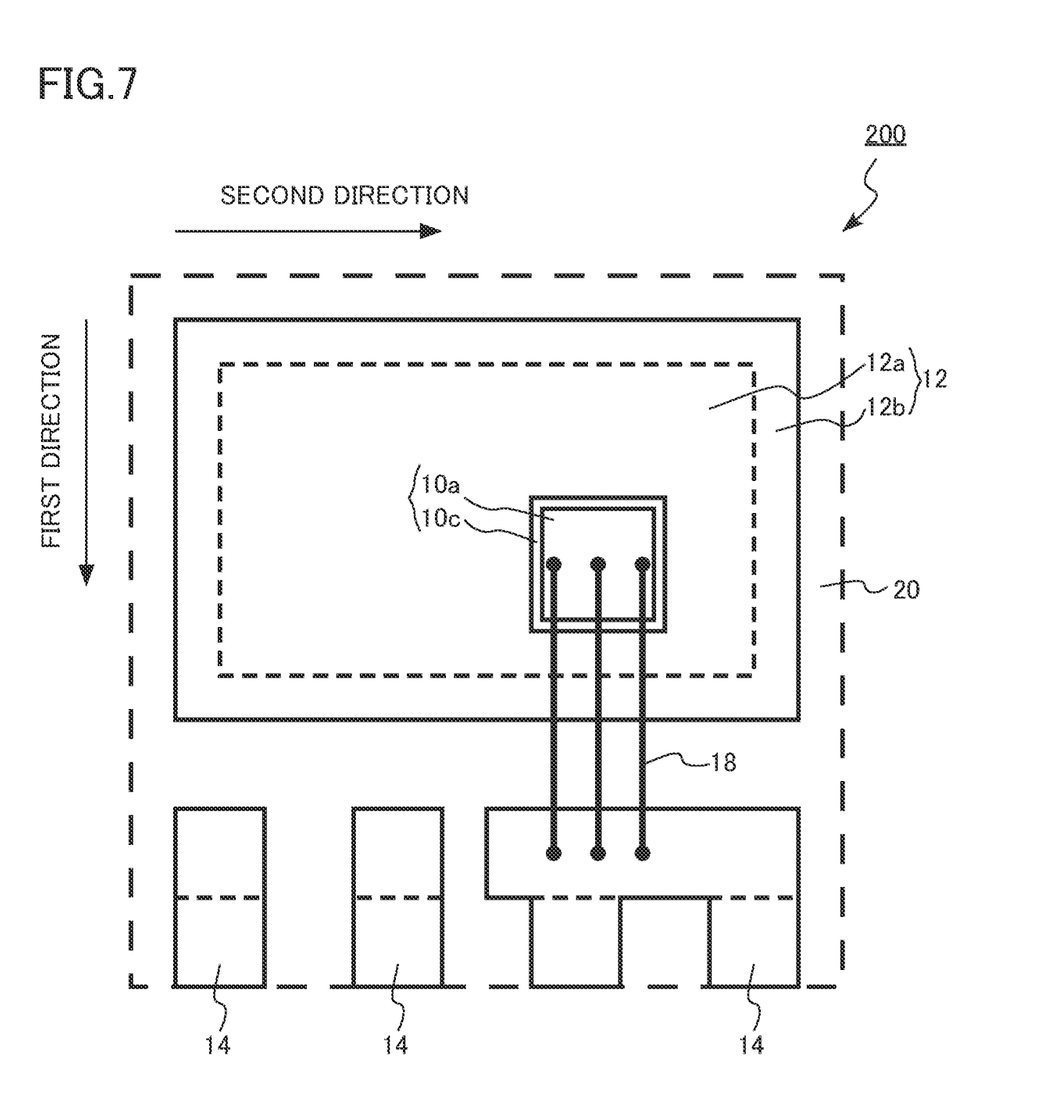
FIG. 7 is a schematic top view of a semiconductor device of a second embodiment.

FIG. 7 is a schematic top view of the semiconductor device of the second embodiment. FIG. 7 is a diagram corresponding to FIG. 1 of the first embodiment.

The semiconductor device of the second embodiment is a semiconductor device 200. In the semiconductor device 200, similarly to the semiconductor device 100 of the first embodiment, a diode chip containing a silicon carbide layer is packaged with resin.

In the semiconductor device 200, the angles formed by all the extension directions of the plurality of bonding wires 18 and the first direction are equal to or less than 5°. FIG. 7 illustrates a case where the angle formed by the extension direction of the bonding wire 18 and the first direction is 0°, that is, the extension direction of the bonding wire 18 and the first direction are parallel.

As a result of the study by the inventors, it was confirmed that the peeling of the diode chip 10 was suppressed by setting the angle formed by the extension direction of the bonding wire 18 and the first direction to be equal to or less than 5°. Although the cause is not necessarily clear, it is thought that this is due to the effect that the direction of the stress applied to the diode chip 10 is limited to the first direction by the plurality of bonding wires 18.

From the viewpoint of suppressing the peeling of the diode chip 10, the angles formed by all the extension directions of the plurality of bonding wires 18 and the first direction are preferably equal to or less than 3°, more preferably equal to or less than 1°, and even more preferably 0°.

As described above, according to the second embodiment, it is possible to realize a semiconductor device in which the peeling of a semiconductor chip is suppressed to improve the reliability.

Third Embodiment

A semiconductor device of a third embodiment is different from the semiconductor device of the second embodiment in that a plurality of bonding wires include a first bonding wire and a second bonding wire and a position where the first bonding wire is connected to the upper electrode and a position where the second bonding wire is connected to the upper electrode are shifted from each other in the first direction. Hereinafter, the description of a part of the content overlapping the first and second embodiments may be omitted.

Figure 8:
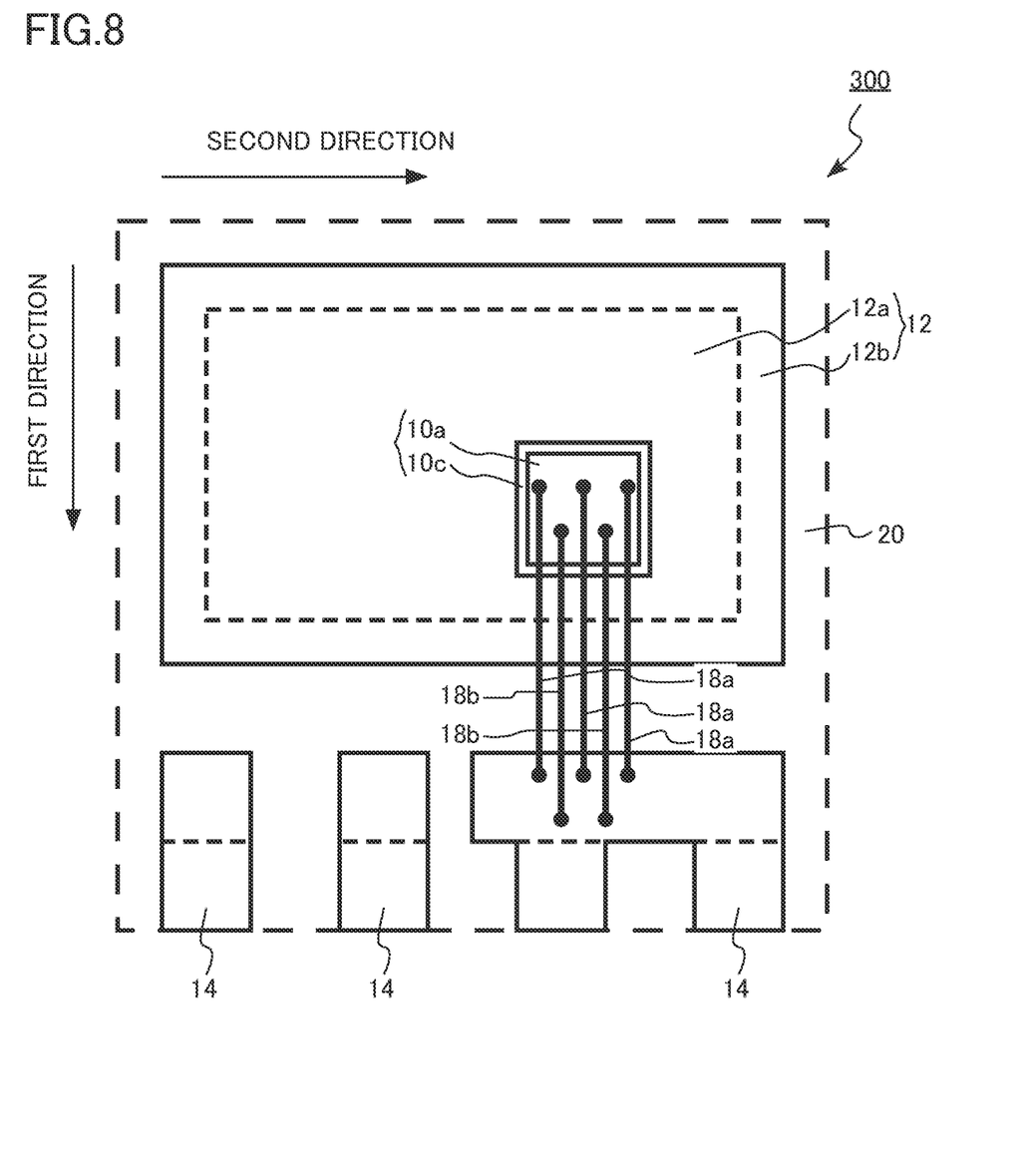
FIG. 8 is a schematic top view of a semiconductor device of a third embodiment.

FIG. 8 is a schematic top view of the semiconductor device of the third embodiment. FIG. 8 is a diagram corresponding to FIG. 1 of the first embodiment and FIG. 7 of the second embodiment.

The semiconductor device of the third embodiment is a semiconductor device 300. In the semiconductor device 300, similarly to the semiconductor device 100 of the first embodiment, a diode chip containing a silicon carbide layer is packaged with resin.

The semiconductor device 300 includes a first bonding wire 18a and a second bonding wire 18b. The first bonding wire 18a and the second bonding wire 18b are adjacent to each other in the second direction. The angles formed by all the extension directions of the first and second bonding wires 18a and 18b and the first direction is equal to or less than 5°.

The position where the first bonding wire 18a is connected to the anode electrode 10a and the position where the second bonding wire 18b is connected to the anode electrode 10a are shifted from each other in the first direction. In addition, the position where the first bonding wire 18a is connected to the lead portion 14 and the position where the second bonding wire 18b is connected to the lead portion 14 are shifted from each other in the first direction.

With the above-described configuration, in the semiconductor device 300, it is possible to shorten the distance between adjacent bonding wires as compared with the semiconductor device 200. Therefore, it is possible to increase the number of bonding wires for connecting the anode electrode 10a and the lead portion 14 to each other.

In the semiconductor device 300, the peeling of the diode chip 10 is suppressed by shortening the distance between the adjacent bonding wires to increase the number of bonding wires. By shortening the distance between the first and second bonding wires 18a and 18b adjacent to each other, the amount of resin layer 20 between the adjacent bonding wires is reduced. It is thought that the reduction in the amount of resin layer 20 between the adjacent bonding wires reduces the stress applied to the diode chip 10 by the bonding wires.

As described above, according to the third embodiment, it is possible to realize a semiconductor device in which the peeling of a semiconductor chip is suppressed to improve the reliability.

In the first to third embodiments, a diode has been described as an example of the semiconductor chip. However, the semiconductor chip is not limited to the diode. For example, the semiconductor chip may be a metal oxide semiconductor field effect transistor (MOSFET) or an insulated gate bipolar transistor (IGBT).

In the first to third embodiments, the case where the number of bonding wires is 3 or 5 has been described as an example. However, the number of bonding wires can be any number.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a die pad including a first region and a second region fully surrounding the first region and thinner than the first region;
   a silicon-carbide diode chip including an upper electrode, a lower electrode, and a silicon carbide layer between the upper electrode and the lower electrode, the silicon-carbide diode chip provided on an upper surface of the die pad, and the silicon-carbide diode chip entirely provided in the first region;
   a solder layer provided between the lower electrode and the upper surface, and the solder layer connecting the lower electrode and the upper surface and in direct contact with the lower electrode and the upper surface, a thickness of the solder layer being greater than a thickness of the upper electrode and a thickness of the lower electrode, and less than a thickness of the silicon carbide layer;
   a lead portion provided in a first direction of the die pad;
   a plurality of bonding wires connecting the upper electrode and the lead portion to each other; and
   a resin layer surrounding the silicon-carbide diode chip and the plurality of bonding wires, and the upper surface of the die pad being fully covered by the resin layer,
   wherein
   an angle formed by an extension direction of each of the plurality of bonding wires and the first direction is equal to or less than 5°,
   the plurality of bonding wires includes a first bonding wire and a second bonding wire,
   the first bonding wire is connected to the upper electrode at a first position and the first bonding wire is connected to the lead portion at a second position,
   the second bonding wire is connected to the upper electrode at a third position and the second bonding wire is connected to the lead portion at a fourth position, and
   the first position, the third position, the second position, and the fourth position are positioned in the first direction in this order.

2. The semiconductor device according to claim 1, wherein a first distance between the silicon-carbide diode chip and the second region in a direction parallel to the upper surface is equal to or more than a thickness of the silicon carbide layer.

3. The semiconductor device according to claim 1, wherein a second distance between the silicon-carbide diode chip and an end of the die pad in the first direction is shorter than a third distance between the silicon-carbide diode chip and an end of the die pad in a direction opposite to the first direction.

4. The semiconductor device according to claim 3, wherein a difference between the third distance and the second distance is equal to or more than a width of the silicon-carbide diode chip in the first direction.

5. The semiconductor device according to claim 1, wherein a thickness of the solder layer is equal to or less than 10 µm.

6. The semiconductor device according to claim 1, wherein a distance between the second position and the fourth position in the first direction is larger than a distance between the first bonding wire and the second bonding wire in a second direction perpendicular to the first direction.

7. The semiconductor device according to claim 1, wherein
   the plurality of bonding wires further includes a third bonding wire and a fourth bonding wire,
   the third bonding wire is connected to the upper electrode at a fifth position and the third bonding wire is connected to the lead portion at a sixth position, the fourth bonding wire is connected to the upper electrode at a seventh position and the fourth bonding wire is connected to the lead portion at an eighth position, and the fifth position, the seventh position, the sixth position, and the eighth position are positioned in the first direction in this order.

8. The semiconductor device according to claim 7,
wherein the first, second, third, and fourth bonding wires are positioned along a second direction of the die pad that crosses the first direction in this order.

9. The semiconductor device according to claim 8,
wherein a distance between the first bonding wire and the second bonding wire is same as a distance between the second bonding wire and the third bonding wire and a distance between the third bonding wire and the fourth bonding wire.

10. The semiconductor device according to claim 7,
the plurality of bonding wires further includes a fifth bonding wire, the fifth bonding wire is connected to the upper electrode at a ninth position and the fifth bonding wire is connected to the lead portion at a tenth position, and the ninth position, the seventh position, the tenth position, and the eighth position are positioned in the first direction in this order.

11. The semiconductor device according to claim 1,
wherein a side surface of an end of the die pad in the first direction, a side surface of an end of the die pad in a direction opposite to the first direction, a side surface of an end of the die pad in a second direction of the die pad that is perpendicular to the first direction, and a side surface of an end of the die pad in a direction opposite to the second direction, are covered by the resin layer.

12. The semiconductor device according to claim 1,
wherein a width of the silicon-carbide diode chip in the first direction is less than a half of a width of the first region in the first direction, and a width of the silicon-carbide diode chip in a second direction perpendicular to the first direction is less than a half of a width of the first region in the second direction.

* * * * *